(12) United States Patent
Deutsch et al.

(10) Patent No.: US 7,006,931 B2
(45) Date of Patent: Feb. 28, 2006

(54) SYSTEM AND METHOD FOR EFFICIENT ANALYSIS OF TRANSMISSION LINES

(75) Inventors: Alina Deutsch, Chappaqua, NY (US); Peter Feldmann, New York, NY (US); Albert E. Ruehli, Chappaqua, NY (US); Howard Harold Smith, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 10/776,716

(22) Filed: Feb. 11, 2004

(65) Prior Publication Data

US 2005/0177325 A1 Aug. 11, 2005

(51) Int. Cl.
*G01R 15/00* (2006.01)
(52) U.S. Cl. .................................... 702/57; 333/116
(58) Field of Classification Search ............ 702/57, 702/58, 108, 117, 120, 122; 327/551; 700/292; 333/116
See application file for complete search history.

(56) References Cited

U.S. PATENT DOCUMENTS

| | | | |
|---|---|---|---|
| 4,812,995 A * | 3/1989 | Girgis et al. ............ | 700/292 |
| 5,625,328 A * | 4/1997 | Coleman, Jr. ............ | 333/116 |
| 6,392,503 B1 * | 5/2002 | Thornton ................. | 333/116 |
| 2004/0041624 A1 * | 3/2004 | Hester ..................... | 327/551 |
| 2004/0230387 A1 * | 11/2004 | Bechhoefer ............ | 702/58 |

OTHER PUBLICATIONS

Rui Wang, Omar Wing; Transient Analysis of Dispersive VLSI Interconnects Terminated in Nonlinear Loads; IEEE Transactions on Computer-Aided Design, vol. 11 No. 10 Oct. 1992; pp. 1258-1277.
Albert E. Ruehli and Thomas A. Johnson; Circuit Analysis Computing of Semiconductor Packages and Systems; Wiley Encyclopedia of Electrical and Electronics Engineering, vol. 3; pp. 339-354, 1999.

* cited by examiner

*Primary Examiner*—Jonathan R. Miller
*Assistant Examiner*—Xiuqin Sun
(74) *Attorney, Agent, or Firm*—Keusey, Tutunjian & Bitetto, P.C.; Satheesh K. Karra, Esq.

(57) ABSTRACT

A system and method for analyzing a circuit with transmission lines includes determining which sources influence each of a plurality of transmission lines, based on coupling factors. Transmission line parameters are computed based on the sources, which influence each transmission line. A transient response or frequency response is analyzed for each transmission line by segmenting each line to perform an analysis on that line. The step of analyzing is repeated using waveforms determined in a previous iteration until convergence to a resultant waveform has occurred.

20 Claims, 6 Drawing Sheets

Schedule an ordering for subcircuit analysis by neighbor-to-neighbor sequencing, by taking active aggressor lines first, etc.

400

Continue with process of FIG. 2

FIG. 4

SYSTEM AND METHOD FOR EFFICIENT
ANALYSIS OF TRANSMISSION LINES

BACKGROUND OF THE INVENTION

1. Field of the Invention

The present invention relates to electrical circuit analysis, and more particularly to analysis of circuits, which involve transmission lines.

2. Description of the Related Art

Electrical circuits with transmission lines are analyzed using circuits and numerical techniques to ensure proper functioning of the circuits. Examples of such circuits include power distribution systems, which need to be analyzed for stability and other properties. The coupling and coupled signals between multiple lines is an important aspect of these power distribution systems.

Another example includes the analysis of circuits on microprocessor chips where a bus with hundreds of wires is to be analyzed to determine whether the wire to wire coupling is excessive.

Similar issues occur in electronic circuitry where noise coupled between transmission lines needs to be understood and minimized. Such issues occur in, e.g. instrumentation and/or computer circuitry in racks or cabinets.

The prior art uses multiple wire transmission line analysis techniques. Such techniques are described, for example, in the book by Clayton Paul, *Analysis of Multiconductor Transmission Lines*, Wiley, 1994, Chapter 5. Chapter 5 also includes the method of characteristics, which are used to make models for multi-conductor transmission lines. These techniques are suitable for the analysis of models with a few lines; however, the complexity increases rapidly as the number of lines increases.

Some simplified techniques have been used to approximate the solution for many transmission lines with neighbor-to-neighbor wire coupling only. These approaches are suitable where reduced accuracy is acceptable to gain speed.

The prior art is limited in the number of coupled lines or wired they can analyze simultaneously. The complexity of the coupling calculation is increases rapidly as the number of lines increases, and the accuracy of the results decreases with the increasing number of lines. Hence, the prior art is unable to handle a large number of lines due to excessive computation time and the results become questionable. Some prior art techniques ignore the couplings for more than two lines to speed up the process.

Some techniques are based on having only linear circuits to speed up the calculation process. These approaches are therefore unsuitable for handling even typical transmission line circuits, which include surrounding nonlinear drivers and receivers. Therefore, a need exists for an improved system and method for analyzing the coupling effects of transmission lines in electrical circuits to assure the proper function of the circuits. A further needed exists for a method and system for analyzing these effects timely and accurately.

SUMMARY OF THE INVENTION

A system and method for analyzing a circuit with transmission lines includes determining which sources influence each of a plurality of transmission lines, based on coupling factors. Transmission line parameters are computed based on the sources, which influence each transmission line. A transient or frequency response is analyzed for each transmission line by segmenting each line to perform an analysis on that line. The step of analyzing is repeated using waveforms determined in a previous iteration until convergence to a resultant waveform has occurred.

A computer system for analyzing one or more electrical circuits, the electrical circuits having two or more coupled lines, one of the lines being a victim line and one or more of the lines being an aggressor line includes one or more circuit models and a transmission analysis process that selects one or more of the aggressor lines, being selected aggressor lines, and one or more rejected aggressor lines. The selected aggressor lines have a coupling factor with the victim line that is above a coupling threshold. A solver process is includes that performs a nonlinear circuit analysis on the circuit model using the victim line and the selected aggressor lines but not the rejected aggressor lines.

The victim line may be adjacent to one or more of the selected aggressors. The transmission analysis process may include the steps of determining a propagated signal for each of the selected aggressor lines; monitoring a coupling of the propagated signal on a first victim for each of the selected aggressor lines; monitoring a coupling of the victim couple signal on one or more second victims; comparing the victim couple signal to a previous victim couples signal on the respective victim; and repeating the steps until the comparison meets a comparison criteria.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein:

FIG. 4 is a block/flow diagram showing a system/method for scheduling/ordering computation of subcircuits in accordance with one embodiment of the present invention;

DETAILED DESCRIPTION OF PREFERRED EMBODIMENTS

The present invention provides systems and methods for analyzing electrical circuits with transmission lines. In particular, the present invention provides ways for accounting for noise and other coupled effects from multiple neighboring lines and from the surroundings.

One embodiment of the present invention in includes a system and method for analyzing one or more electrical circuits where the electrical circuits have two or more coupled lines. One or more of the lines may be referred to as victim lines and one or more of the other lines may be referred to as an aggressor line or lines. The system provides one or more circuit models and a transmission analysis process that selects one or more of the aggressor lines (selected aggressor lines) and one or more rejected aggressor lines. The selected aggressor lines include a coupling factor with victim lines that have a value above a coupling threshold. A solver process performs a non-linear circuit analysis on the circuit model using the victim line and the selected aggressor lines but not the rejected aggressor lines. In this way, the analysis provides an electrical response that considers all surrounding influences on a given transmission line. This and other embodiments will be described in greater detail herein.

It should be understood that the elements shown in the FIGS. may be implemented in various forms of hardware, software or combinations thereof. Preferably, these elements are implemented in software on one or more appropriately programmed general-purpose digital computers having a processor and memory and input/output interfaces.

Figure 1:
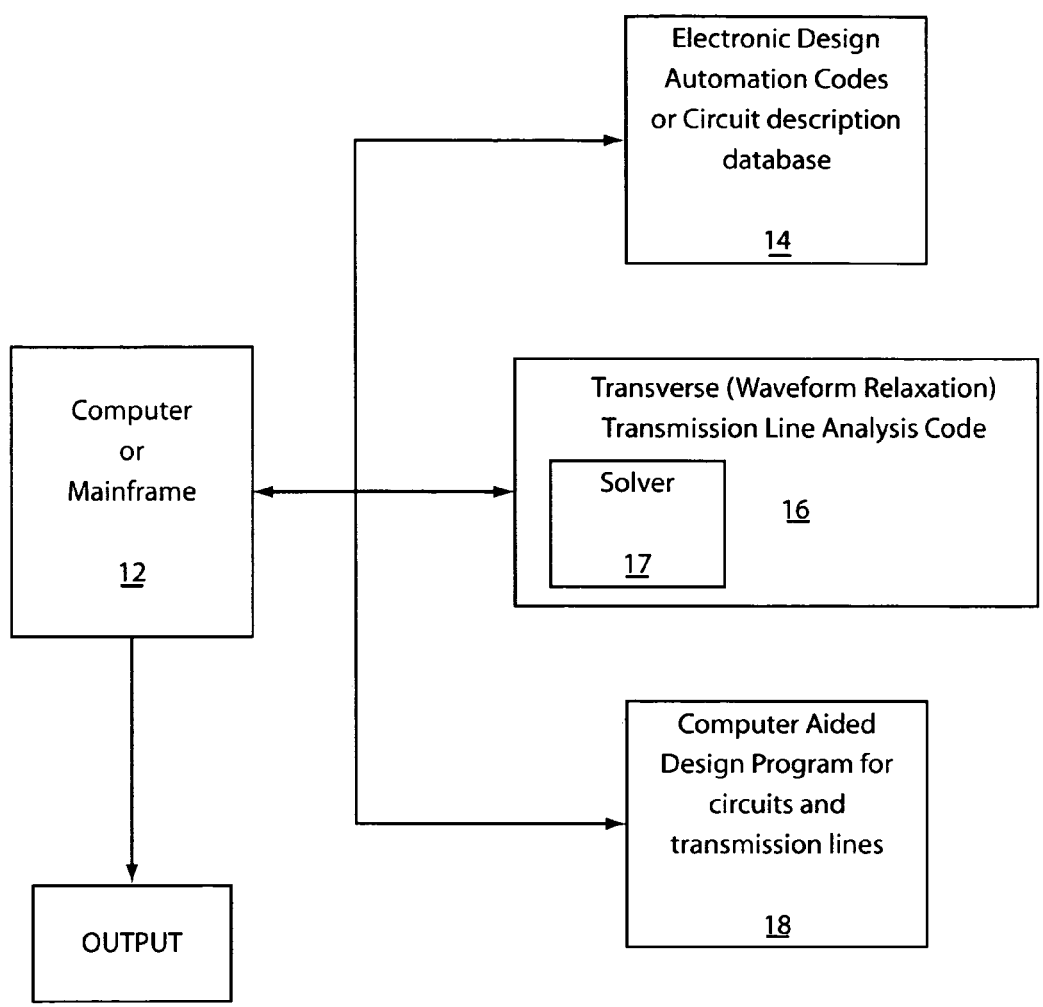
FIG. 1 is a block diagram of showing a system in accordance with one embodiment of the present invention.

Referring now in detail to the figures in which like numerals represent the same or similar elements and initially to FIG. 1, an exemplary system 10 is shown to illustrate one embodiment of the present invention. System 10 preferably includes a computer 12, which may be a personal computer or a mainframe. Computer 12 includes any interface devices known in the art. Computer 12 may include a plurality of modules or software packages that may be resident in the system or coupled thereto via a network or the like. For example, computer 12 may be provided access to electronic design automation (EDA) libraries or other circuit databases 14, which include electrical circuits or integrated circuit chip designs.

A module 16 may include one more programs or subroutines for carrying out methods in accordance with the present invention. Module 16 may include transmission line analysis programs, including a solver 17 or code to determine coupling factors, perform sliding calculations, update coupling models and perform transient analysis, among other things as will be described in greater detail herein below. Module 16 may be incorporated into other programming packages, such as full-blown circuit analysis systems or programs.

A computer aided design (CAD) module or program 18 may be include to import designs or design information to the system 10 to provide the appropriate circuit analysis. CAD schematics and or EDA data from database 14 may be employed as inputs to module 16 to analyze components of a design, and preferably transmission lines in the design.

Figure 2:
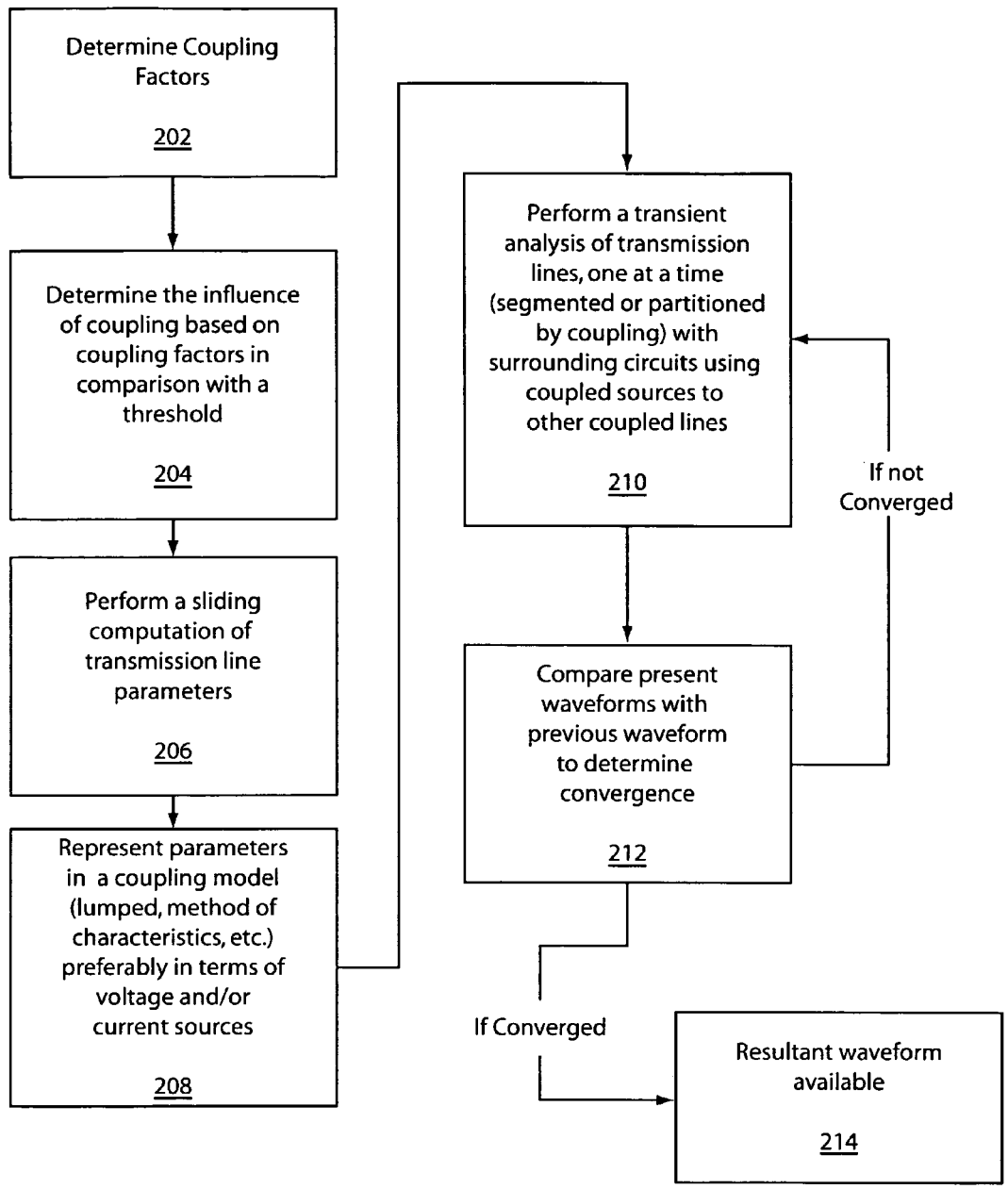
FIG. 2 is a block/flow diagram showing a system/method for transmission line analysis using a transverse waveform relaxation process in accordance with an illustrative embodiment of the present invention.

Referring to FIG. 2, a block/flow diagram depicts a program/method for implementing module 16 in accordance with one embodiment of the present invention. The transmission line analysis process may be referred to as a transverse waveform relaxation process. In circuit designs, one or more transmission lines may be present. To handle a plurality of coupled lines, the impact of each neighboring transmission line needs to be considered.

The present invention addresses neighbor-to-neighbor coupling early on in the process. This keeps the problem sparse if the model includes a large number of coupled transmission lines. Also, a coupling model of parameters, which have to be computed at the same time, is limited to a relatively small number. The model limits the number of coupled sources needed to represent the couplings. Then, each wire is individually analyzed as a subcircuit while the coupled sources are taken into account, and the waveforms between the last two iterations are compared to check for convergence.

In block 202, coupling factors are determined for transmission lines in a given design. Coupling factors are determined by calculating the influence of neighboring lines on a given line. In one embodiment, an inductance coupling factor (cf) may be calculated as:

$$cf = \frac{L_{12}}{\sqrt{L_{11}L_{22}}}$$

where $L_{12}$ is the inductive influence of $L_2$ on $L_1$ (coupling term) and $L_{11}$ is the inductance of line 1 and $L_{22}$ is the inductance of line 2 (these may be referred to as self terms). A similar coupling factor can be calculated for resistance $$\left(cf = \frac{R_{12}}{\sqrt{R_{11}R_{22}}}\right)$$

and capacitance $$\left(cf = \frac{C_{12}}{\sqrt{C_{11}C_{22}}}\right).$$

Other coupling factors may be used and preferably dimensionless variables. Also, default values, e.g., 0.001, may be inserted into the program for coupling factors to ensure a nonzero number exists in the case where the coupling factor is not available or for other reasons.

The coupling factors are estimated first with approximate computations. This leads to the knowledge of how many transmission lines are to be included in each segment of the calculation. The segments are computed in an overlapping way such that all the interactions are taken into account so that each line can be analyzed individually taking into account the pertinent couplings for each line.

After calculating the coupling factors for transmission lines in a design, the coupling factors are compared to a threshold value(s), in block 204, to determine if they will have an influence on neighboring lines. For example, $L_{coupling} < L_{tolerance}$; $C_{coupling} < C_{tolerance}$; and $R_{coupling} < R_{tolerance}$.

The tolerance or threshold is preferably set by a designer but can also be calculated based on parameters or criteria for a given design. For example, in sensitive equipment, a smaller tolerance may be needed meaning smaller influences should be considered in analyzing transmission line parameters. Coupling factors that are determined to be too small may be disregarded in future calculations for a given segment. However, since many circuits are dynamic and different portions of a circuit may be operational at a different time, different time frames may be investigated to ensure a complete solution.

For example, for a given line, coupling factors are employed to determine the influence of other lines on the line in question. Based on these estimates, the calculations are segmented for each line to include the most influential coupling effects.

In block 206, a sliding computation is performed to calculate transmission line parameters (L, C and R). These calculations are preferably based on geometric features. The calculation of the per-unit line parameters L, R, and C is preferably performed in a segmented way, e.g., one line at a time, since the simultaneous calculation of these matrix quantities is very expensive for more than a few lines. Hence, each segmented calculation will include the computation of the L, R, C parameters for a number of lines. The number of steps needed to determine these parameters is much smaller than the total number of lines since the most influential lines are considered. This simplifies the evaluation of the L, R, C parameters since each sub-problem is much smaller than the large single evaluation of each parameter.

For example, assuming 100 transmission lines, the coupling evaluation determines that 5 lines should be included near each line to accurately take the coupling into account. So for the sliding calculation, the first 15 lines are evaluated simultaneously using, for example, a standard field solver for L, R and C. This result can be used for the first 10 lines in the transverse waveform relaxation (WR) approach given herein. Then, in a next sliding field calculation, the next L, R, C, are evaluated for 15 lines from line 10 to line 25. Then, this calculation can be used to evaluate the transverse WR for lines 11 to 20, etc. Hence, the field calculation, is completed only on a subset of the lines which is much faster since the compute time of the field solver increases enormously with the number of lines considered.

In one embodiment, the characteristics of a circuit as defined in a CAD schematic are employed to make these sliding calculations. The sliding calculations provide a baseline for the transient analysis as will be described hereinafter.

Based on the sliding computation, in block 208, a coupling model or models are employed to reduce the circuit characteristics into terms of voltage and/or current sources with lumped elements (L, R, C)(See e.g., FIG. 6) or alternately uses the method of characteristic models to model the circuit.

In block 210, a transient of frequency domain analysis of the transmission lines is performed preferably one wire at a time. The transient/frequency analysis is based on a transmission line response to surrounding circuits using coupled sources to other coupled lines as provided by the models set forth in block 208.

In a preferred embodiment, partitioning along the coupling of the lines is performed. In other words, each line is taken one at a time considering the most pertinent coupling influences on that line. Alternately, partitioning over the length of the line may be performed as well or in addition to a calculation for the partitioning of the coupling of the line.

In block 212, the transient analysis of block 210 is repeated until convergence is achieved by comparing a previous value of the waveforms determined by the transient analysis from a previous iteration to the waveforms determined in the present iteration. If convergence is achieved the resultant waveforms have been determined and are available in block 214. If convergence has not yet been achieved, then the program returns to block 210 to recalculate the waveforms.

Figure 3:
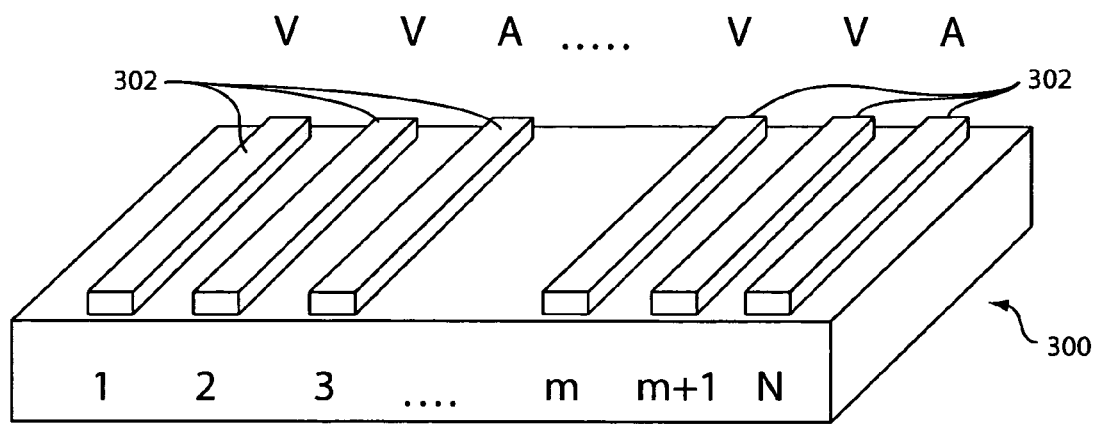
FIG. 3 depicts an illustrative geometry for a multiple transmission lines to be analyzed in accordance with the present invention.

Referring to FIG. 3, example geometry for a multi-transmission line geometry is illustratively shown. Transmission lines 302 are numbered 1 to N in the depicted section of a circuit 300. Lines 302 are marked with an A to indicate that they are aggressor lines. These lines are exited with some external circuitry. In contrast, the lines which are marked with a V are victim lines which are not excited with external sources.

Using one method, e.g., set forth with reference to FIG. 2, the subcircuits/lines of FIG. 3 are analyzed starting at line 1, in sequence, until line N is reached. This sequence is followed for each calculation in FIG. 2. Then, the sequence is repeatedly followed go until convergence in the transient/frequency analysis (e.g., blocks 210 and 212).

A more efficient method is based on signal flow. For example, initially, all coupled waveform sources are set to zero. Then, starting with the analysis of the circuits, which include the aggressors (A) first, new coupled-source quantities are available from the coupling model (block 206). Then, the nearest neighbors are analyzed since they will include the largest signals next to the aggressors. The process progresses through all the wires until all of the wires have been visited. In each step/iteration, the latest, updated waveforms are employed.

These methods are directly applicable to parallel processing for circuit problems, which include transmission lines. Each of the N transmission lines forms a separate subsystem with a transverse decoupling scheme (e.g., portioning along coupling lines or effects). Further partitioning is possible along the length of the line using conventional techniques.

Partitioning or segmenting line by line (coupling) leads to 2n subsystems which can be analyzed on separate processors where the only information that needs to be exchanged between processors is waveforms. Hence, an enormous gain in speeding up the process by parallel processing is achieved.

Referring to FIG. 4, a step for scheduling or prioritizing an order for circuits to be analyzed is shown. Block 400 may be performed prior to block 202 in FIG. 2 or may be performed as needed at any point in the process. The scheduling of the calculation may be performed based on aggressor lines being calculated first and then nearest neighbors to the aggressor lines moving outward therefrom. Scheduling may include an algorithm for determining a best order for analyzing the transmission lines of a circuit.

Figure 5:
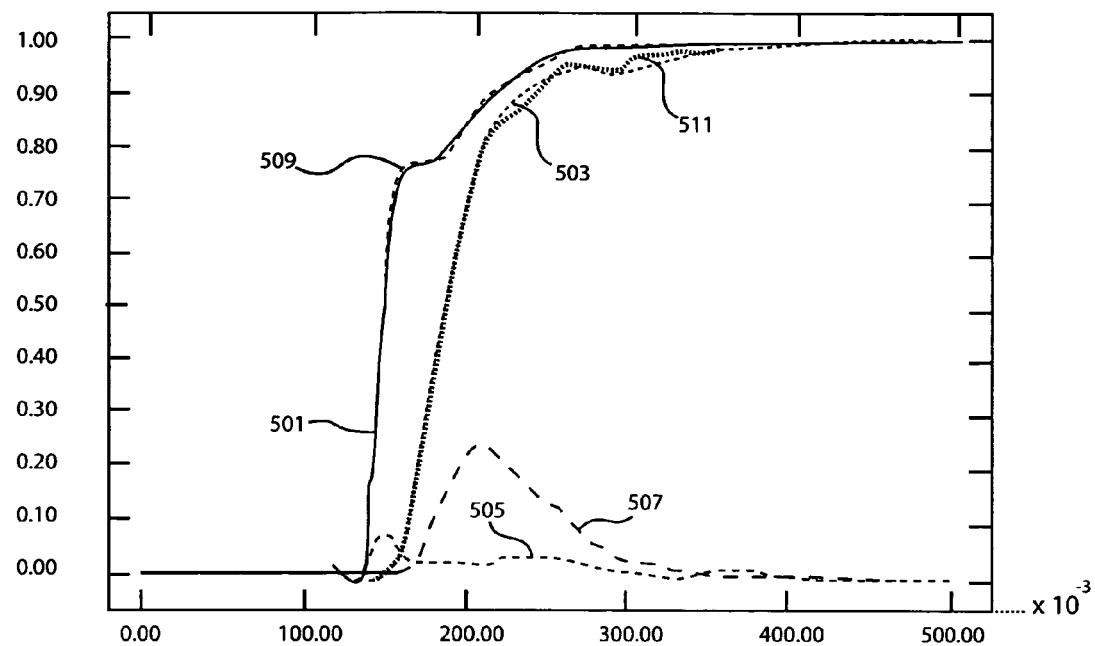
FIG. 5 is an illustrative graph showing convergence of waveforms within two iterations using the present invention.

Referring to FIG. 5, a graph shows convergence of waveforms within two iterations of applying the method of the present invention. Input and output waveforms 501 and 503 are calculated theoretically. Upon application of the present invention, a first iteration yields input and output waveforms 505 and 507. Waveforms 505 and 507 overlap the calculated (exact) solution and cannot be seen in FIG. 5 due to the overlap. In a second iteration, waveforms show convergence after two iterations for the input and output waveforms 509 and 511. The near and far end coupled waveforms are shown to have converged.

The analysis of multiple transmission lines shows that more than two neighboring wires should be included to get an accurate coupled waveform for the case where 2 or more neighboring active lines are present. It should be noted that waveform iterations are needed to increase as a function of the transmission line coupling factor. More iterations are needed if the coupling factor is higher. In accordance with the invention, even a coupling factor of 0.5, which is extremely high for practical transmission lines, only needs 5 or less iterations to converge to a result.

Figure 6:
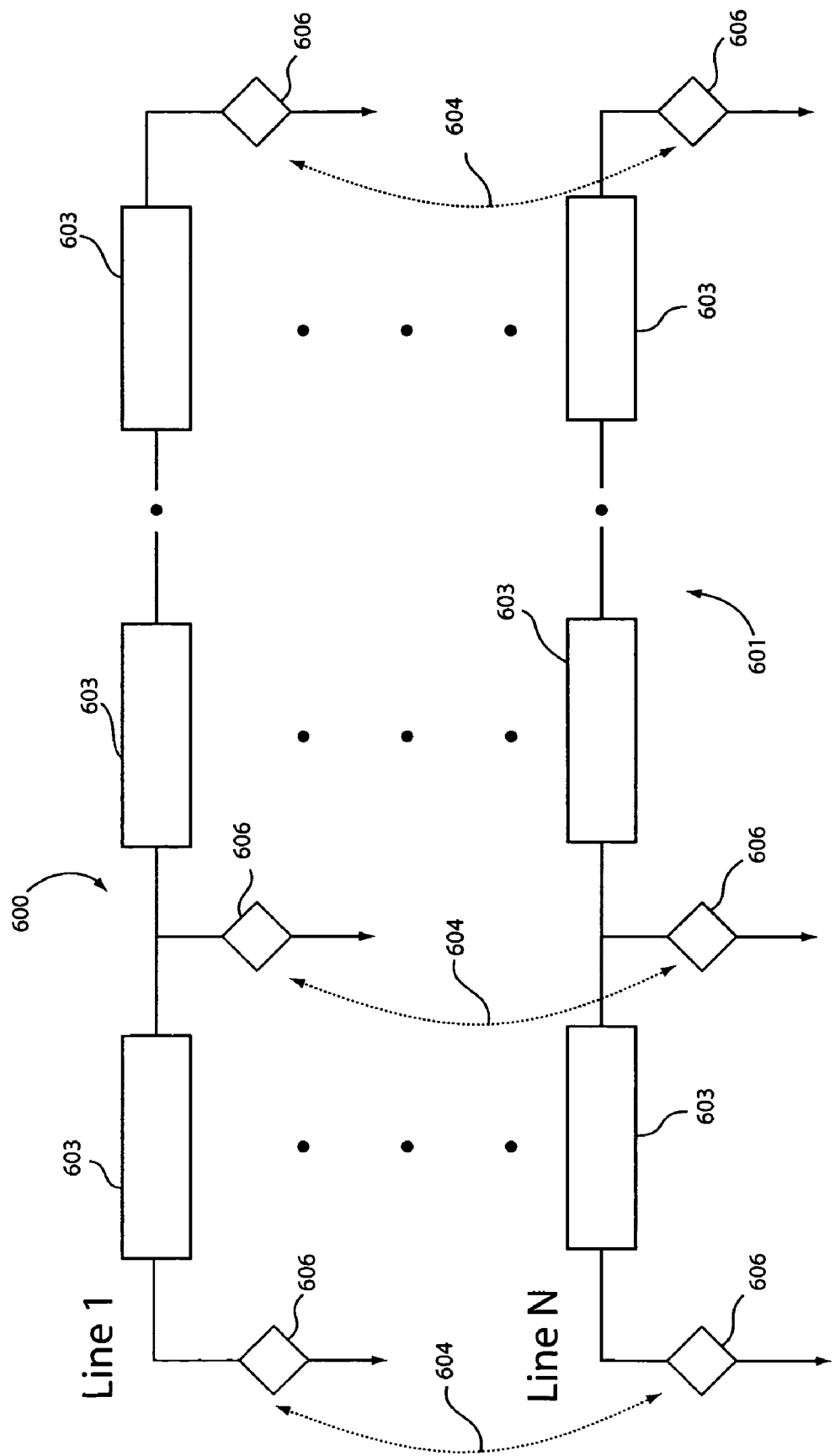
FIG. 6 is a schematic diagram showing coupling models for transverse coupling between multiple transmission lines in accordance with one aspect of the present invention.

Referring to FIG. 6, exemplary coupling models 600 and 601 for the transverse coupling between multiple transmission lines are illustratively shown. Several different models can be used to represent the transverse coupling between transmission lines. This is schematically shown in FIG. 6.

Models 600 and 601 lumped circuit models with lumped and/or distributed elements 603. The lumped circuit models have sections where the coupling between the sections is shown by dashed arrows 604. Depending on the circuit model, sources 606 are voltage or current sources. Alternately or additionally, method of characteristics models represents another class of problems where the coupling is performed mainly by a set of sources at the end of the lines or sections. In the iteration process, the sources 606 are updated as the results become available in the solution process.

Having described preferred embodiments of a system and method for efficient analysis of transmission lines (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for analyzing a circuit with transmission lines, comprising the steps of:
   scheduling an order for analyzing transmission lines;
   based on coupling factors, determining which sources influence each of a plurality of transmission lines;
   computing transmission line parameters based on the sources which influence each transmission line;
   analyzing a transient or frequency response for each transmission line by segmenting each line to perform an analysis on that line; and
   repeating the step of analyzing using waveforms determined in a previous iteration until convergence to a resultant waveform has occurred.

2. The method as recited in claim 1, wherein the step of determining which sources influence each of a plurality of transmission lines includes calculating coupling factors for each transmission line based on neighboring sources.

3. The method as recited in claim 1, further comprising the step of modeling the transmission lines in terms of voltage and/or current sources.

4. The method as recited in claim 3, wherein the step of modeling includes employing lumped models.

5. The method as recited in claim 3, wherein the step of modeling includes employing method of characteristics models.

6. The method as recited in claim 1, further comprising the step of performing an analysis of the transmission lines based on an electronic form of an electrical circuit.

7. The method as recited in claim 1, wherein the order includes analyzing aggressor lines before victim lines.

8. The method as recited in claim 1, wherein the order includes analyzing lines in a neighbor-to-neighbor sequence.

9. A program storage device readable by machine, tangibly embodying a program of instructions executable by the machine to perform method steps for analyzing a circuit with transmission lines, as recited in claim 1.

10. A method for analyzing a circuit with transmission lines, comprising the steps of:
    scheduling an order for analyzing transmission lines;
    determining coupling factors for a plurality of transmission lines;
    based on the coupling factors, eliminating sources which influence a transmission line less than a threshold amount;
    computing transmission line parameters based on the sources which influence each transmission line;
    representing each line as a coupling model to describe the line;
    analyzing a transient response for each model of a transmission line by segmenting each line to perform an analysis on that line; and
    repeating the step of analyzing using waveforms determined in a previous iteration until convergence to a resultant waveform has occurred.

11. The method as recited in claim 10, wherein the step of representing each line as a coupling model includes modeling the transmission lines in terms of voltage and/or current sources.

12. The method as recited in claim 11, wherein the step of modeling includes employing lumped models.

13. The method as recited in claim 11, wherein the step of modeling includes employing method of characteristics models.

14. The method as recited in claim 10, further comprising the step of performing an analysis of the transmission lines based on an electronic form of an electrical circuit.

15. The method as recited in claim 10, wherein the order includes analyzing aggressor lines before victim lines.

16. The method as recited in claim 10, wherein the order includes analyzing lines in a neighbor-to-neighbor sequence.

17. A program storage device readable by machine, tangibly embodying a program of instructions executable by the machine to perform method steps for analyzing a circuit with transmission lines as recited in claim 10.

18. A system for analyzing an electrical circuit, the electrical circuit having two or more coupled lines, the system comprising:
    one or more circuit models;
    a transmission analysis program that selects or rejects aggressor lines based on a coupling factor value determined relative to one or more victim lines; and
    a solver that performs a circuit analysis on the circuit model using the victim lines and the selected aggressor lines but not the rejected aggressor lines.

19. The system as recited in claim 18, wherein the victim lines are adjacent to one or more of the selected aggressors.

20. The system as recited in claim 18, wherein the transmission analysis program performs the steps of:
    determining a propagated signal for each of the selected aggressor lines;
    monitoring a coupling of the propagated signal on a first victim line for each of the selected aggressor lines;
    monitoring a coupling of the victim line couple signal on one or more second victims;
    comparing the victim line couple signal to a previous victim line couple signal on the respective victim; and
    repeating until the step of comparing meets a comparison criterion.

* * * * *